United States Patent
Moon et al.

(10) Patent No.: US 7,971,633 B2
(45) Date of Patent: Jul. 5, 2011

(54) LOOP TYPE MICRO HEAT TRANSPORT DEVICE

(75) Inventors: Seok Hwan Moon, Daejeon (KR); Gunn Hwang, Seoul (KR); Sung Weon Kang, Daejeon (KR); Chang Auck Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1020 days.

(21) Appl. No.: 11/577,233

(22) PCT Filed: Dec. 9, 2005

(86) PCT No.: PCT/KR2005/004209
§ 371 (c)(1),
(2), (4) Date: Apr. 13, 2007

(87) PCT Pub. No.: WO2006/062371
PCT Pub. Date: Jun. 15, 2006

(65) Prior Publication Data
US 2007/0256814 A1    Nov. 8, 2007

(30) Foreign Application Priority Data

Dec. 10, 2004 (KR) .................. 10-2004-0104284
May 24, 2005 (KR) .................. 10-2005-0043467

(51) Int. Cl.
*H05K 7/20* (2006.01)
(52) U.S. Cl. ............... 165/104.26; 165/104.33; 361/700
(58) Field of Classification Search .................. None
See application file for complete search history.

(56) References Cited

U.S. PATENT DOCUMENTS

| 4,602,679 A * | 7/1986 | Edelstein et al. ........ 165/104.26 |
| 4,611,474 A * | 9/1986 | Musinski ........................ 62/51.1 |
| 5,179,043 A | 1/1993 | Weichold et al. |
| 6,679,318 B2 * | 1/2004 | Bakke ........................ 165/104.26 |

(Continued)

FOREIGN PATENT DOCUMENTS

JP    2004-044990    2/2004

(Continued)

OTHER PUBLICATIONS

"Cooling Effect of a MEMS Based Micro Capillary Pumped Loop for Chip-Level Temperature Control", by Jeffrey Kirshberg et al., ASME 2000.

(Continued)

*Primary Examiner* — Allen J Flanigan
(74) *Attorney, Agent, or Firm* — Rabin & Berdo, P.C.

(57) ABSTRACT

Provided is a loop type micro heat transport device including: a lower plate having a reservoir for storing operating fluid at its upper surface, an evaporating part spaced apart from the reservoir to evaporate the operating fluid, and a condensing part for condensing vapor evaporated from the evaporating part; and an upper plate engaged with an upper surface of the lower plate and formed at a position corresponding to the evaporating part and the condensing part, and including a vapor space having a vapor line through which the vapor evaporated from the evaporating part is transported to the condensing part, wherein the operating fluid is circulated through the reservoir, the evaporating part, and the condensing part. Therefore, it is possible to remarkably improve productivity since its simple structure helps to make the manufacture simple, as well as to improve cooling performance and enabling long distance heat transport.

6 Claims, 6 Drawing Sheets

U.S. PATENT DOCUMENTS

| | | | |
|---|---|---|---|
| 6,889,756 B1 * | 5/2005 | Hou | 165/104.33 |
| 6,976,527 B2 * | 12/2005 | Kirshberg et al. | 165/104.33 |
| 6,999,314 B2 * | 2/2006 | Tonosaki et al. | 361/700 |
| 2003/0066625 A1 | 4/2003 | Kirshberg et al. | |
| 2004/0052057 A1 * | 3/2004 | Ohmi et al. | 361/720 |
| 2004/0069460 A1 * | 4/2004 | Sasaki et al. | 165/104.26 |

FOREIGN PATENT DOCUMENTS

| | | |
|---|---|---|
| JP | 2004-077051 A | 3/2004 |
| JP | 2004-108760 | 4/2004 |
| JP | 2004-190985 | 7/2004 |
| KR | 1020040017211 | 2/2004 |
| KR | 1020040032471 | 4/2004 |
| KR | 10-2004-0103151 A | 12/2004 |

OTHER PUBLICATIONS

:Steady-State Modeling and Testing of a Micro Heat Pipe, B. R. Babin et al., Journal of Heat Transfer, Aug. 1990, vol. 112/595-601.

* cited by examiner

[Figure 1]
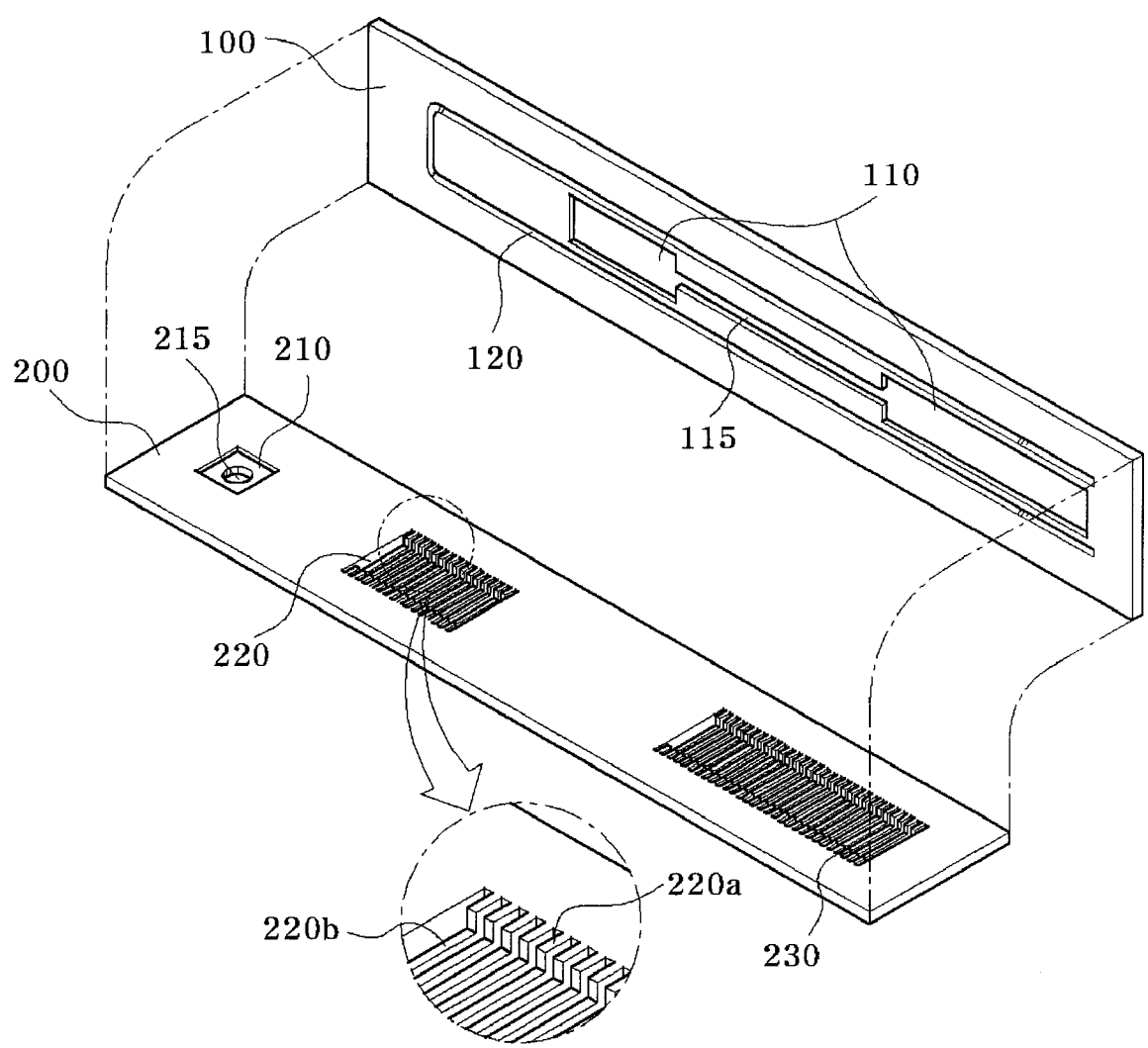

[Figure 2]
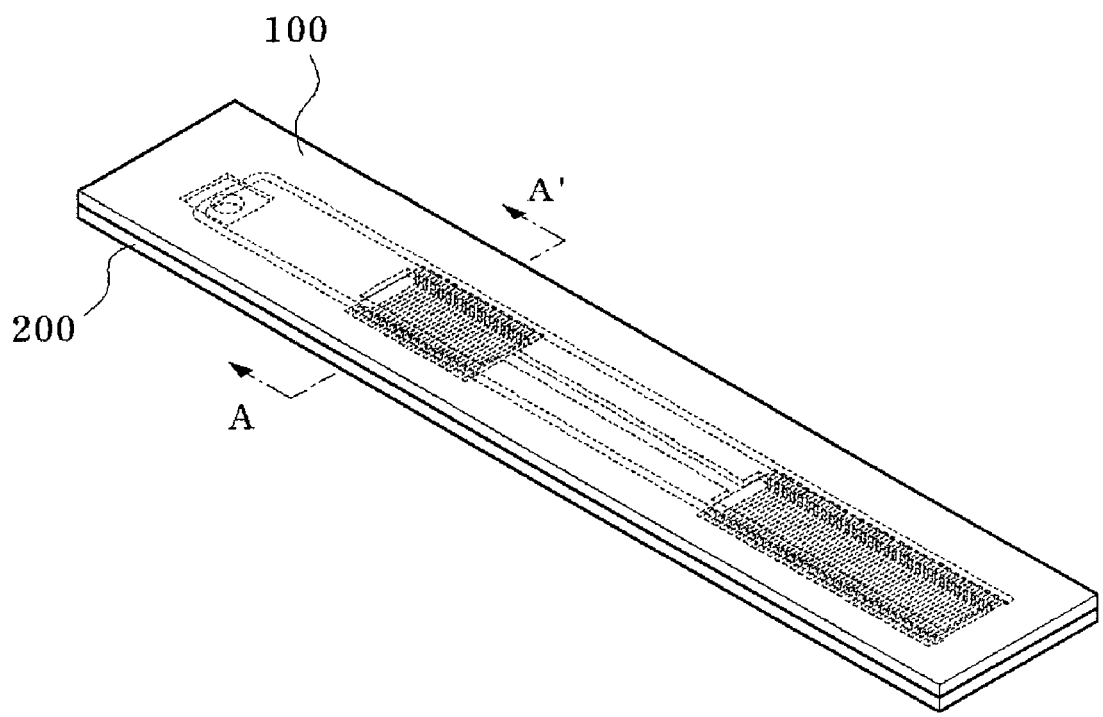
[Figure 3]
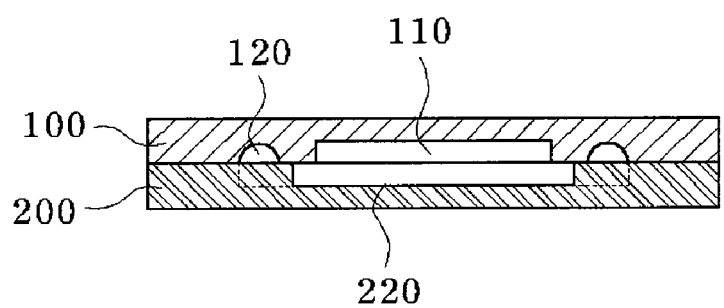

[Figure 4]
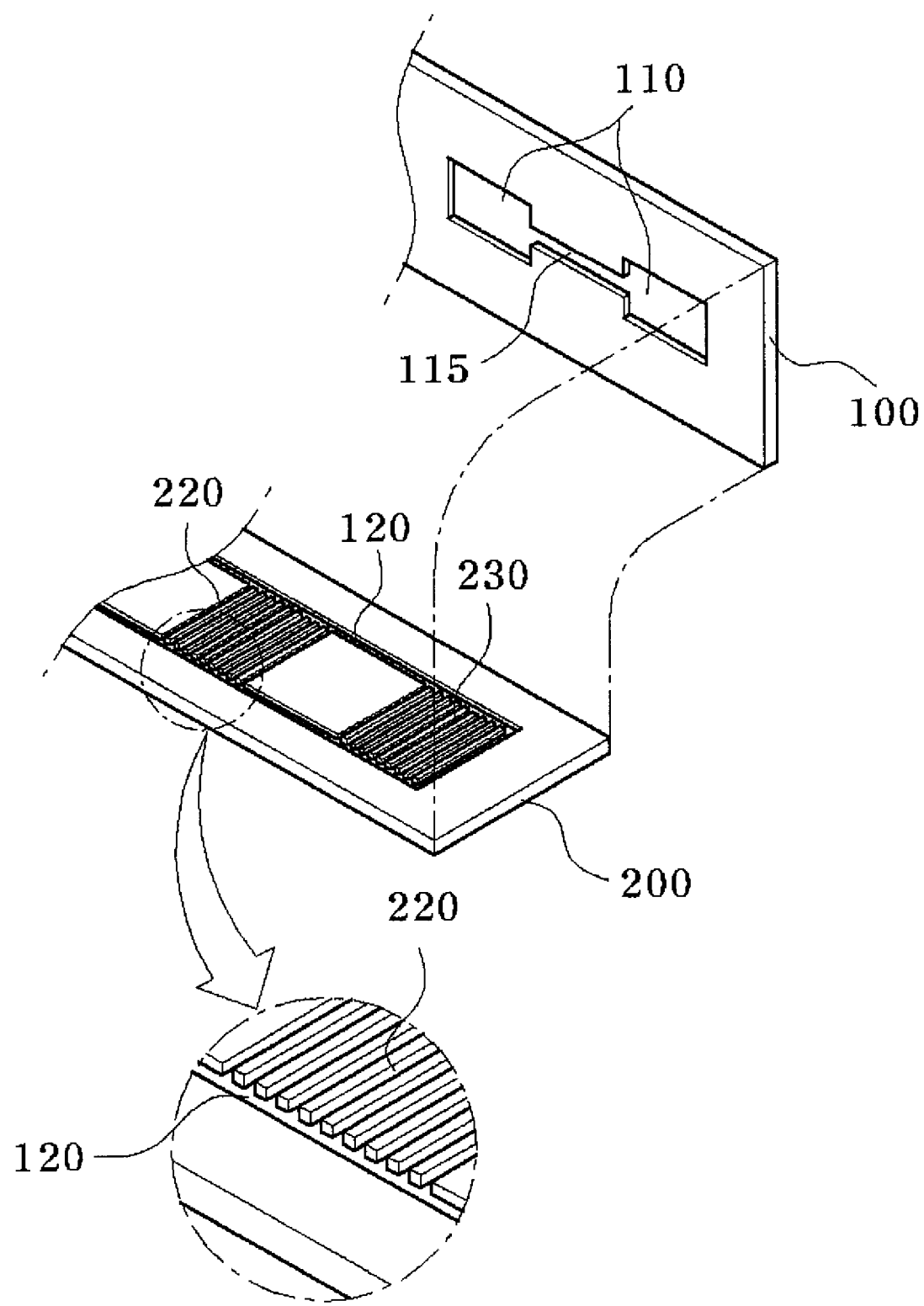

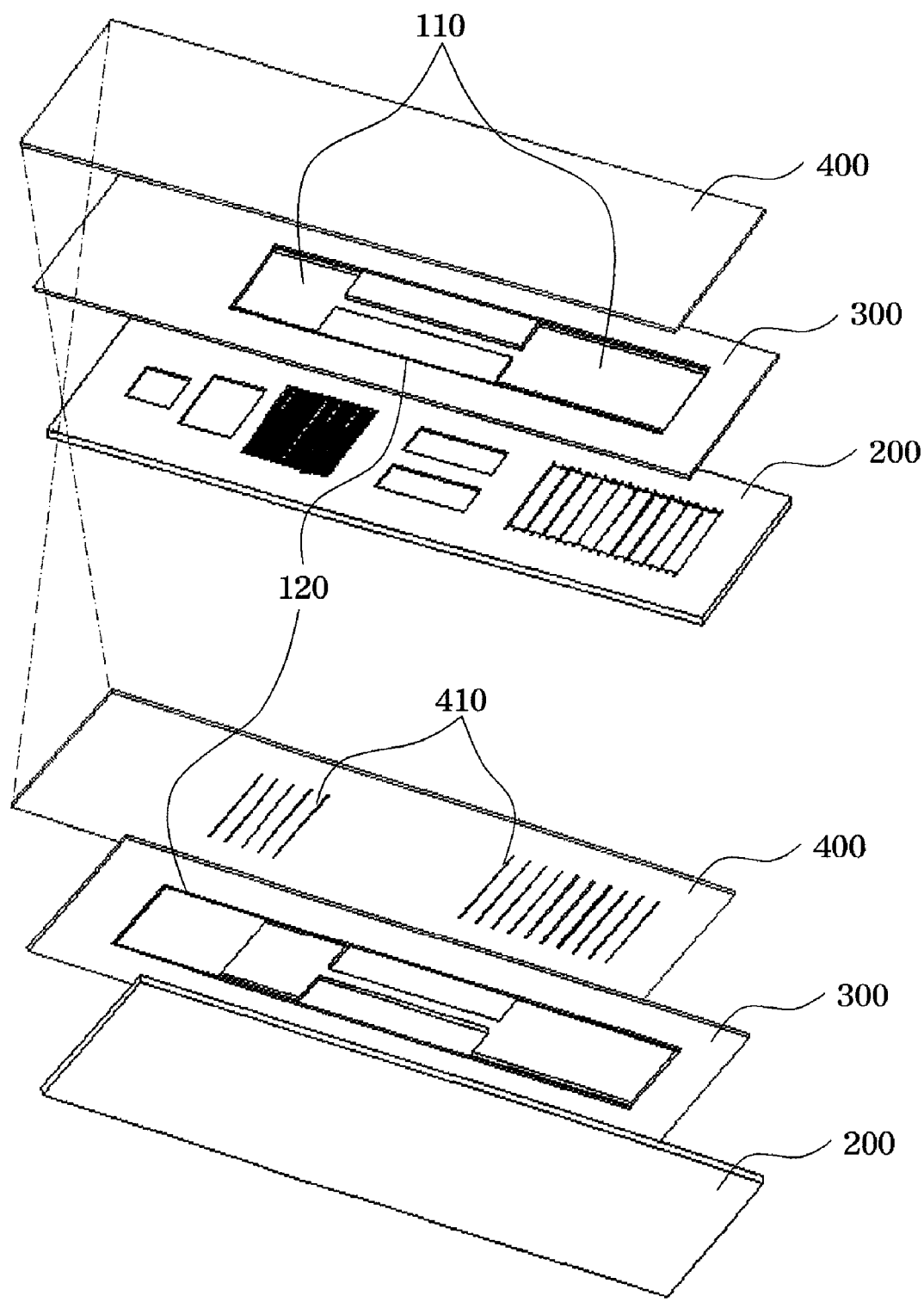
[Figure 5]

【Figure 6】
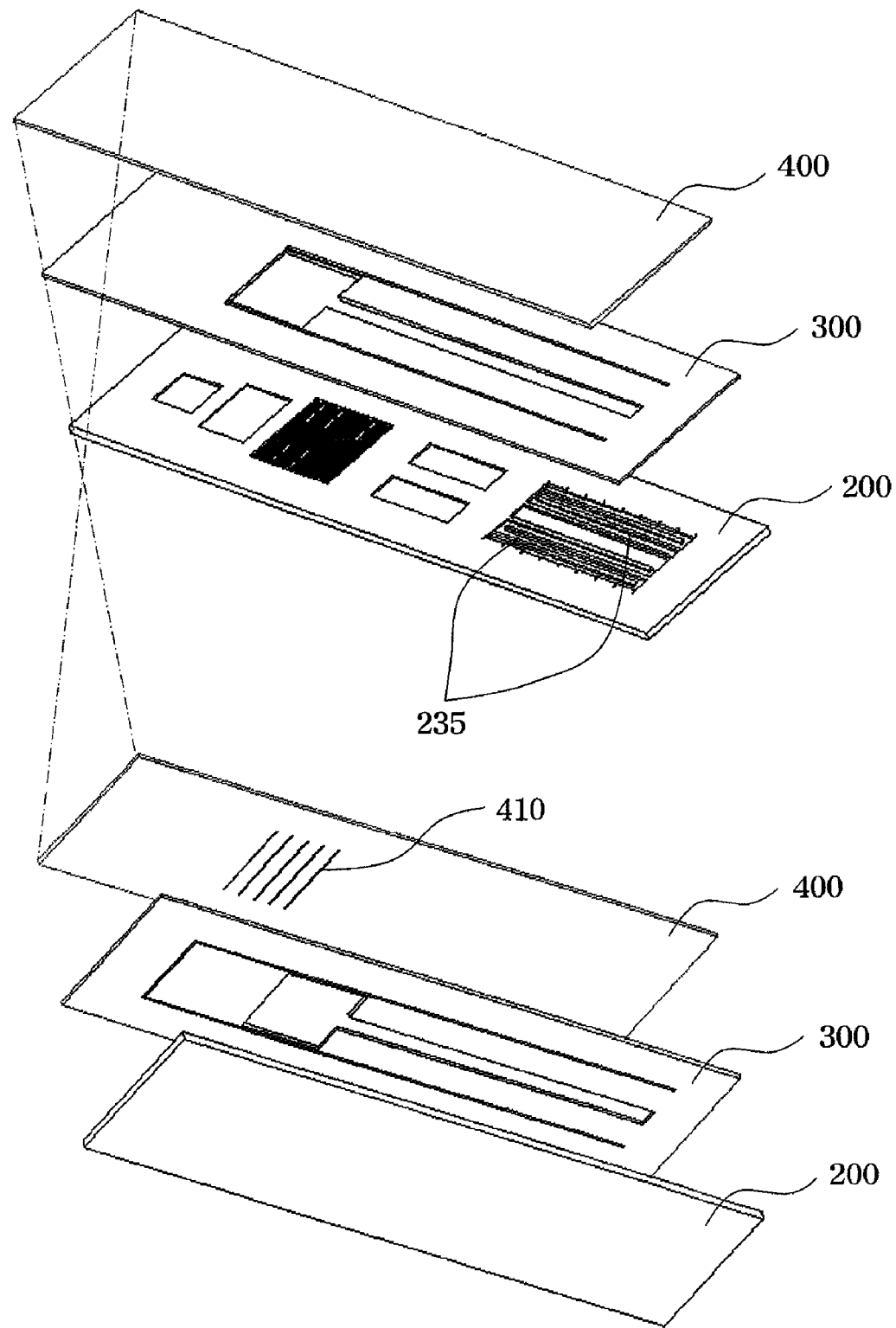

【Figure 7】
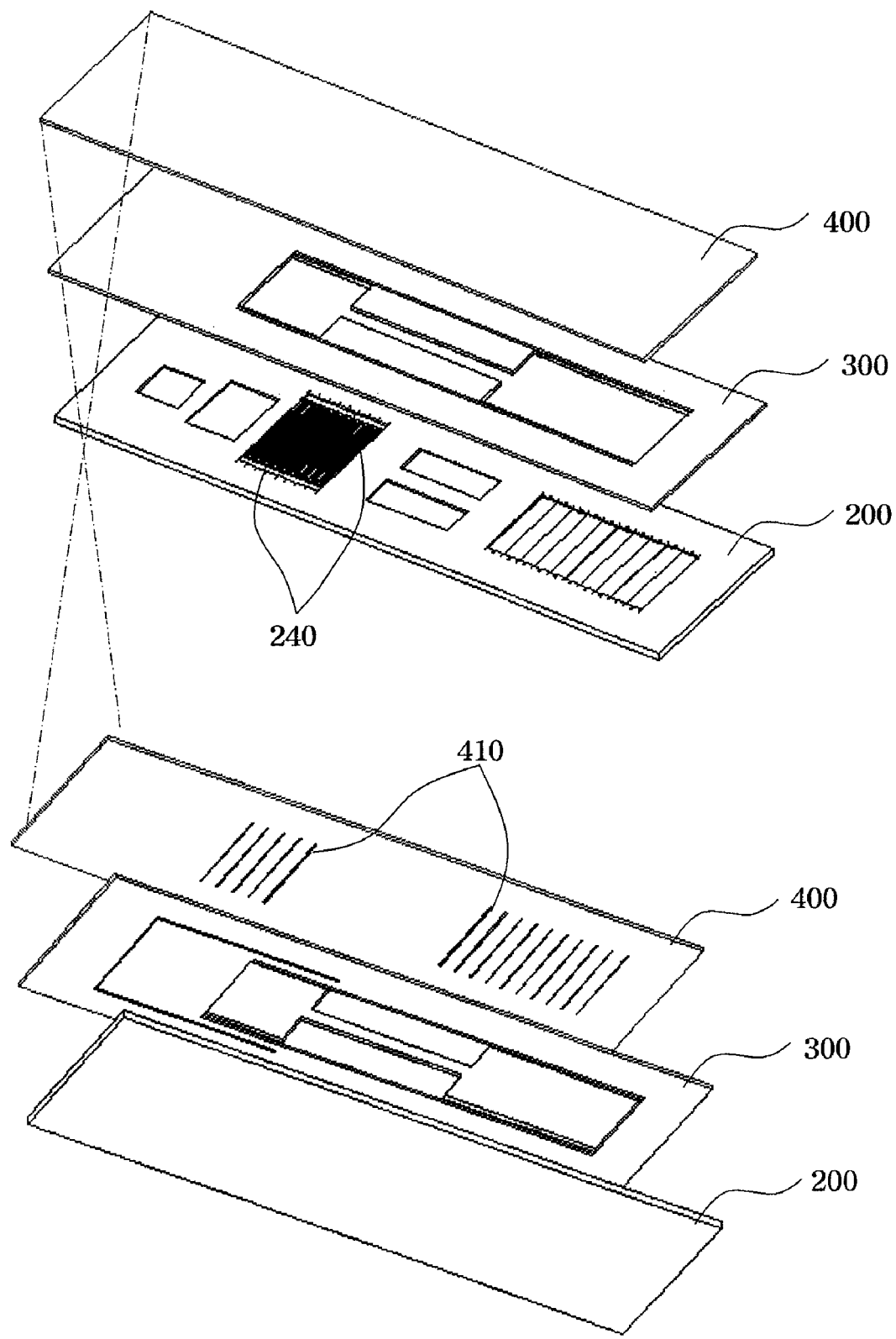

LOOP TYPE MICRO HEAT TRANSPORT DEVICE

TECHNICAL FIELD

The present invention relates to a loop type micro heat transport device, and more particularly, to a loop type micro heat transport device capable of preventing pressure drop due to friction at an interface between gas and liquid, improving cooling performance, and enabling long-distance heat transport, by separately forming vapor and liquid transport lines.

BACKGROUND ART

Recently, as performance of computers and various mobile electronic and communication devices gets higher, their sizes are being continuously miniaturized. However, the inner structure of the miniaturized mobile devices is very densely integrated, so that there is little empty space to thereby provide disadvantages in heat dissipation.

It is difficult for small-sized mobile devices such as notebook computers and sub-notebook computers of the electronic and communication devices to employ cooling devices to dissipate heat generated therefrom and discharge the heat to the exterior, due to their size. Conventional cooling devices may be a simple thermal conduction type device that a material having good thermal conductivity is installed appropriate to a package structure of the device. In addition, there exist a fan and heat pipe-type device, a liquid circulation-type device, and so on.

The fan and heat pipe-type device is provided with a vent hole formed at a side chassis of the device so that heat transported from a heat source through a heat pipe is discharged through the vent hole. The liquid circulation-type device, which is the most typical type device, has very excellent heat transport performance in comparison with other cooling type devices.

Such cooling type devices are being widely used in the compact mobile devices. However, as the electronic package structure in the compact mobile device becomes more and more densely integrated, there are difficulties in employing the conventional cooling devices due to its size.

That is, it is not easy to find a cooling method capable of transporting heat to a relatively long distance in the case that the package structure has a small inner volume and thickness. For example, when a small heat pipe is pressed to a thickness smaller than about 2 mm, its heat transport performance is remarkably reduced to make it difficult to transport the heat to a distance longer than about 50 mm. Meanwhile, other cooling methods also have disadvantages in thermal conductivity or size to make it difficult to apply them.

DISCLOSURE

Technical Problem

The present invention is directed to a simple structure of loop type micro heat transport device capable of preventing pressure drop due to friction at an interface between gas and liquid, improving cooling performance, and enabling long-distance heat transport, by separately forming vapor and liquid transport lines.

Technical Solution

In an exemplary embodiment of the present invention, there is provided a loop type micro heat transport device including: a lower plate having a reservoir for storing operating fluid at its upper surface, an evaporating part spaced apart from the reservoir to evaporate the operating fluid, and a condensing part for condensing vapor evaporated from the evaporating part; and an upper plate engaged with an upper surface of the lower plate and formed at a position corresponding to the evaporating part and the condensing part, and including a vapor space having a vapor line through which the vapor evaporated from the evaporating part is transported to the condensing part, wherein the operating fluid is circulated through the reservoir, the evaporating part, and the condensing part.

In another exemplary embodiment of the present invention, there is provided a loop type micro heat transport device including: a lower plate having a reservoir for storing operating fluid at its upper surface, an evaporating part spaced apart from the reservoir to evaporate the operating fluid, and a condensing part for condensing vapor evaporated from the evaporating part; an intermediate plate engaged with an upper surface of the lower plate and formed at a position corresponding to the evaporating part and the condensing part, and including a vapor space having a vapor line through which the vapor evaporated from the evaporating part is transported to the condensing part; and an upper plate engaged with an upper surface of the intermediate plate, and having a micro channel for dispersing liquid condensed on the plate, wherein the operating fluid is circulated through the reservoir, the evaporating part, and the condensing part.

Preferably, a liquid line may be formed at a lower surface of the upper plate or the intermediate plate so that the operating fluid is circulated through the reservoir, the evaporating part, and the condensing part.

Preferably, the liquid line may be formed at an upper surface of the lower plate so that the operating fluid is circulated through the reservoir, the evaporating part, and the condensing part.

Preferably, the liquid line may be formed in a "C" shape so that a pair of lines is formed at both sides of the vapor line.

Preferably, the liquid line may be formed in an "L" shape so that a single line is formed at one side of the vapor line.

Preferably, the upper and lower plates may be formed of one selected from the group consisting of silicon, glass, copper, polymer, and aluminum.

Preferably, the evaporating part and the condensing part may have a multi-channel capillary structure.

Preferably, the condensing part may be formed of a serpentine channel

Preferably, the evaporating part and the condensing part may have a multi-channel capillary structure with at least one step.

Preferably, separate liquid reservoirs may be installed adjacent to both sides of the evaporating part, i.e. the liquid line

Advantageous Effects

The loop type micro heat transport device in accordance with the present invention is capable of preventing pressure drop due to friction at an interface between gas and liquid, improving cooling performance, and enabling long-distance heat transport, by separately forming vapor and liquid transport lines. In addition, it is possible to obtain higher productivity since its simple structure helps to make the manufacture simple.

In addition, since the two-stage multi-channel capillary structure of the lower plate in accordance with the present invention can prevent a counterflow of the vapor, there is no necessity to manufacture a separate structure for preventing the counterflow.

Further, the present invention has various advantages capable of adaptably adjusting the thickness and length of the plates according to the heat density of the electronic device, freely changing positions of the evaporating part, the condensing part, the liquid path, and the vapor path, and mounting various types of plates in an inner package structure of the mobile electronic device.

DESCRIPTION OF DRAWINGS

The above and other features of the present invention will be described in reference to certain exemplary embodiments thereof with reference to the attached drawings in which:

FIG. 1 is an exploded perspective view of a loop type micro heat transport device in accordance with an embodiment of the present invention;

FIG. 2 is an assembled perspective view of a loop type micro heat transport device in accordance with an embodiment of the present invention;

FIG. 3 is a cross-sectional view taken along line A-A' of FIG. 2;

FIG. 4 is a partial perspective view of a loop type micro heat transport device in accordance with another embodiment of the present invention; and FIGS. 5 to 7 are exploded perspective views of a loop type micro heat transport device in accordance with another embodiment of the present invention.

MODE FOR INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

FIG. 1 is an exploded perspective view of a loop type micro heat transport device in accordance with an embodiment of the present invention, FIG. 2 is an assembled perspective view of a loop type micro heat transport device in accordance with an embodiment of the present invention, and FIG. 3 is a cross-sectional view taken along line A-A' of FIG. 2.

Referring to FIGS. 1 to 3, the loop type micro heat transport device in accordance with an embodiment of the present invention has a hermetically sealed structure that an upper plate 100 and a lower plate are engaged with each other. An operating fluid is injected into the hermetically sealed structure of the loop type micro heat transport device to perform heat exchange with the exterior through phase change thermal transfer.

In this process, a pair of vapor spaces 110 are formed at a lower surface of the upper plate 100 corresponding to an evaporating part 220 and a condensing part 230 which are formed at an upper part of the lower plate 200.

A vapor line 115 is formed between the pair of vapor spaces 110 to transport the vapor evaporated from the evaporating part 220 to the condensing part 230. At this time, the vapor line 115 is preferably formed to have a single line shape at a center part of the upper plate 100.

In addition, a liquid line 120 is formed at the lower surface of the upper plate 100 so that the operating fluid stored in a reservoir 210 of the lower plate 200 is circulated through the evaporating part 220 and the condensing part 230.

The liquid line 120 is preferably formed to have a "C" shape so that a pair of lines are formed at both sides of the vapor line 115, but not limited thereto, may have a "L" shape so that a single line is formed at a lower side of the upper plate 100, i.e., one side of the vapor line 115 to circulate the operating fluid stored in the reservoir 210 of the lower plate 200 through the evaporating part 220 and the condensing part 230. In addition, the liquid line 120 may have a loop shape.

The reservoir 210 having a hole 215 for injecting a predetermined operating fluid is formed at one side of the upper surface of the lower plate 200 to store the operating fluid injected from the exterior.

In addition, the evaporating part 220 and the condensing part 230 are formed at the upper surface of the lower plate 200 corresponding to the pair of vapor spaces 110, respectively.

The evaporating part 220 is spaced apart from the reservoir 210 and evaporates the operating fluid transported through the liquid line 120 from the reservoir 210. Preferably, the evaporating part 220 is formed to have a multi-channel capillary structure and at least one step. The multi-channel capillary structure can reduce capillary force applied to each channel, thereby improving thermal conduction performance.

The multi-channel structure of the evaporating part 220 applied to the embodiment of the present invention is formed of two stages consisting of an upper part 220a and a lower part 220b. The upper part 220a overlaps and contacts the liquid line 120 of the upper plate 100.

Specifically, liquid returned to the evaporating part 220 through the liquid line 120 is moved to the lower part 220b along grooves of the multi-channel, thereby filling the entire area of the evaporating part 220. Since the two-stage multi-channel capillary structure can prevent a counterflow of the vapor, there is no necessity to manufacture a separate structure for preventing the counterflow.

The condensing part 230 condenses vapor evaporated from the evaporating part 220 transported through the vapor line 115 formed at the upper plate 100. The condensing part 230 also has the same multi-channel capillary structure as the evaporating part 220.

Preferably, the multi-channel capillary structure formed at the condensing part 230 has at least one step. The multi-channel capillary structure can reduce capillary force applied to each channel, thereby improving thermal conduction performance.

Meanwhile, the multi-channel capillary structure of the evaporating part 230 applied to the embodiment of the present invention may be formed at its edge part only, not formed in its central part.

In addition, a sintered structure may be separately inserted into the evaporating part 220 and the condensing part 230 applied to the embodiment of the present invention in order to more improve the capillary force.

After vacuuming the interior of the loop type micro heat transport device, the operating fluid is filled into the device through the operating fluid injection hole 215. Heat transferred to the evaporating part 220 from a predetermined heat source (not shown) evaporates the operating fluid to be changed into a latent heat state. The vapor is transported to the condensing part 230 through the vapor line 115 by a pressure difference, and then the condensing part 230 dissipates and condenses the heat.

The condensed liquid is transported to the evaporating part 220 through the separate liquid line 120, different from the conventional heat pipe that the liquid is transported through the same line as the vapor line 115. At this time, since the vapor and the liquid are transported through the vapor line 115 and the liquid line 120, respectively, there is no pressure drop due to friction at an interface between gas and liquid, thereby obtaining relatively excellent heat transport performance in comparison with the conventional heat pipe.

As described above, the heat entered into the evaporating part 220 is transported to the condensing part 230 as vapor in the latent heat state, condensed in the condensing part 230, and then returned to the evaporating part 220 in the liquid state. The looped circulation process is repeated.

FIG. 4 is a partial perspective view of a loop type micro heat transport device in accordance with another embodiment of the present invention.

Referring to FIG. 4, the loop type micro heat transport device in accordance with another embodiment of the present invention has a hermetically sealed structure that an upper plate 100 and a lower plate 200 are engaged with each other, similar to the embodiment of the present invention.

A pair of vapor spaces 110 are formed at a lower surface of the upper plate 100 corresponding to an evaporating part 220 and a condensing part 230 formed at an upper part of the lower plate 200.

A vapor line 115 is formed between the pair of vapor spaces 110 to transport vapor evaporated from the evaporating part 220 to the condensing part 230.

A reservoir 210 (see FIG. 1) having a hole 215 (see FIG. 1) for injecting a predetermined operating fluid is formed at one side of the upper surface of the lower plate 200 to store the operating fluid injected from the exterior, similar to the embodiment of the present invention, while not shown in FIG. 4.

In addition, the evaporating part 220 and the condensing part 230 are formed at an upper surface of the lower plate 200 corresponding to the pair of vapor spaces 110 formed at the upper plate 100. The evaporating part 220 and the condensing part 230 have the same structure as the embodiment of the present invention, so their descriptions will be omitted.

Differently from the embodiment of the present invention, a liquid line 120 is formed at the upper surface of the lower plate 200 applied to another embodiment of the present invention to circulate the operating fluid injected from the exterior through the reservoir 210, the evaporating part 220, and the condensing part 230.

Similarly to the embodiment of the present invention, the liquid line 120 is preferably formed to have a "C" shape when the upper plate 100 and the lower plate 200 are engaged with each other so that a pair of lines are formed at both sides of the vapor line 115, but not limited thereto, may have a "L" shape so that a single line is formed at a lower side of the upper plate 100, i.e., one side of the vapor line 115 to circulate the operating fluid stored in the reservoir 210 of the lower plate 200 through the evaporating part 220 and the condensing part 230. In addition, the liquid line may have a loop shape.

FIG. 5 is an exploded perspective view of a loop type micro heat transport device in accordance with another embodiment of the present invention. The embodiment shown in FIG. 5 has a basic operational theory and structure similar to that of the loop type heat transport device shown in FIG. 1, except that the structure in FIG. 1 is composed of upper and lower plates and the structure in FIG. 5 is composed of lower, intermediate and upper plates 200, 300 and 400. While the lower plate of FIG. 5 has the same structure as FIG. 1, the liquid line 120 and the vapor spaces 110 formed at the upper plate of FIG. 1 are formed at the intermediate plate 300 in the structure of FIG. 5. Micro channels 410 are formed at a lower surface of the upper plate 400 of FIG. 5 to disperse the condensed liquid.

FIG. 6 is an exploded perspective view of a loop type micro heat transport device in accordance with yet another embodiment of the present invention. The device shown in FIG. 6 is similar to the device in FIG. 5 in that the device in FIG. 6 is composed of three plates and different from the device in FIG. 5 in that a condensing part 235 has a serpentine structure.

FIG. 7 is an exploded perspective view of a loop type micro heat transport device in accordance with still another embodiment of the present invention. The device shown in FIG. 7 is also similar to the device in FIG. 5 in that the device in FIG. 7 is composed of three plates and different from the device in FIG. 5 in that separate liquid reservoirs 240 are installed adjacent to both sides of an evaporating part, i.e. a liquid line.

As can be seen from the foregoing, the loop type micro heat transport device in accordance with the present invention is capable of preventing pressure drop due to friction at an interface between gas and liquid, improving cooling performance, and enabling long-distance heat transport, by separately forming vapor and liquid transport lines. In addition, it is possible to obtain higher productivity since its simple structure helps to make the manufacture simple.

In addition, since the two-stage multi-channel capillary structure of the lower plate in accordance with the present invention can prevent a counterflow of the vapor, there is no necessity to manufacture a separate structure for preventing the counterflow.

Further, the present invention has various advantages capable of adaptably adjusting the thickness and length of the plates according to the heat density of the electronic device, freely changing positions of the evaporating part, the condensing part, the liquid path, and the vapor path, and mounting various types of plates in an inner package structure of the mobile electronic device.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

The invention claimed is:

1. A loop type micro heat transport device comprising:
   a lower plate having a reservoir for storing operating fluid at its upper surface, an evaporating part spaced apart from the reservoir to evaporate the operating fluid, and a condensing part for condensing vapor evaporated from the evaporating part;
   an intermediate plate engaged with an upper surface of the lower plate and formed at a position corresponding to the evaporating part and the condensing part, and including a vapor space having a vapor line through which the vapor evaporated from the evaporating part is transported to the condensing part, the intermediate plate further including a liquid line; and
   an upper plate engaged with an upper surface of the intermediate plate, and having a micro channel for dispersing liquid condensed on the plate,
   wherein the operating fluid is circulated through the reservoir, the evaporating part, and the condensing part, and
   wherein the liquid line is formed in a "C" shape so that a pair of lines are formed at both sides of the vapor line.

2. The loop type micro heat transport device according to claim 1, wherein a liquid line is formed at a lower surface of the intermediate plate or as penetrated shape of the intermediate plate so that the operating fluid is circulated through the reservoir, the evaporating part, and the condensing part.

3. The loop type micro heat transport device according to claim 1, wherein the condensing part is formed of a serpentine channel.

4. The loop type micro heat transport device according to claim 1, wherein the upper and lower plates are formed of one selected from the group consisting of silicon, glass, copper, polymer, and aluminum.

5. The loop type micro heat transport device according to claim 1, wherein the upper plate and the lower plate are engaged with each other to hermetically seal an inner space therebetween.

6. The loop type micro heat transport device according to claim 1, wherein the evaporating part and the condensing part have a multi-channel capillary structure.

* * * * *